United States Patent [19]

Michel

[11] 3,903,581

[45] Sept. 9, 1975

[54] METHOD OF REPAIRING SOLDERED CONNECTIONS

[76] Inventor: Billy J. Michel, 1803 Encino Dr., Escondido, Calif. 92025

[22] Filed: June 3, 1974

[21] Appl. No.: 475,354

[52] U.S. Cl. ........................ 29/401; 29/426; 29/627

[51] Int. Cl.[2] ........................ B23P 7/00; H05K 3/28

[58] Field of Search ....... 29/401 R, 401.7, 426, 427, 29/203 B, 203 V, 627, 481; 228/20

[56] References Cited

UNITED STATES PATENTS

| | | | |
|---|---|---|---|
| 2,877,544 | 3/1959 | Gammel | 29/627 X |
| 3,045,095 | 7/1962 | Usher | 228/20 X |
| 3,411,594 | 11/1968 | Siegel | 228/20 X |
| 3,834,605 | 9/1974 | Coffin | 29/427 X |

*Primary Examiner*—Al Lawrence Smith
*Assistant Examiner*—Nicholas P. Godici
*Attorney, Agent, or Firm*—R. S. Sciascia; G. J. Rubens

[57] ABSTRACT

A method is disclosed for repairing soldered connections, particularly those soldered connections used to connect micro miniature components to printed circuit (PC) boards and cards encapsulated by a protective coating material having a melting temperature higher than the melting temperature of the solder. The novel method enables the component connections to be desoldered expeditiously, and the components replaced without damage to the PC board or printed circuit lines. Thus, the PC board can be repaired and reused instead of being discarded and replaced by a costly new board.

8 Claims, 6 Drawing Figures

METHOD OF REPAIRING SOLDERED CONNECTIONS

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

This invention relates to a method for desoldering electrical connections and more particularly to the repair of PC boards having an encapsulating protective coating, to enable the replacement of electrical components.

To better enable PC boards to withstand adverse environmental conditions, a protective conformal coating is applied to encapsulate the assembled PC board and the component parts. These coatings are designed to resist humidity and moisture, as well as high temperatures and the effects of corrosive chemicals. One such protective coating is "Parylene-C" (poly-mono-chloro-paraxylylene) manufactured by the Union Carbide Company.

Use of the conventional desoldering and repairing techniques by applying heat on a soldered connection encapsulated with such a tough, high temperature coating is not satisfactory. The solder, having a lower melting temperature, melts under the conformal coating and spreads off on the runs, before the coating melts ruining the PC board, or requiring intensive repairs.

Accordingly, certain procedures are currently employed to initially remove the coating. One such technique utilizes a small tool, such as a cutter, to remove the conformal coating. Unfortunately even with careful and delicate manipulation, the use of such tools has a likely detrimental effect of eating away the printed circuit runs, especially the eyelets, requiring considerable repair in lieu of minor repairs. U.S. Pat. No. 3,466,732 is illustrative of such a method. A similar detrimental result is usually obtained by another current method of employing a hot knife for cutting the conformal coating around the soldered connection enabling the coating to be peeled back to desolder the connection. This procedure is time consuming, and even with very careful manipulation, damage to the PC board frequently occurs.

SUMMARY OF THE INVENTION

A novel method has been devised to enable soldered connections covered by a protective conformal coating to be desoldered to permit the repair and/or replacement of an attached component without damage to the printed circuit board. By this method costly printed circuit boards can be repaired simply and expedeitously, and placed back in inventory for subsequent reuse.

The novel method involves the technique of providing inlet and outlet opening through the conformal coating to the soldered connection by means of removing the stub end of the component lead wire and scribing through the conformal coating around the soldered connection. Thereafter, the soldered area is heated to melt the solder, and by means of a conventional vacuum soldering iron the melted solder is removed from the outlet being replaced by air admitted through the inlet opening. Thereafter the pad area is abraded to remove the coating residue, and a new component is installed and the connection resoldered, and retouched with the conformal coating.

STATEMENT OF THE OBJECTS OF INVENTION

A principal object of this invention is to facilitate the repair of soldered connections covered with a conformal coating with minimal damage, if any, to the components parts, enabling the repaired unit to be reused.

Another important object is to accomplish such repair and replacement of defective components in a printed circuit board expeditiously, with high quality workmanship.

Still another important object is to achieve a method of reworking printed circuit boards to effect a savings of time and material.

Other objects, advantages and novel features of the invention will become apparent from the following detailed description of the invention when considered in conjunction with the accompanying drawings.

DESCRIPTION OF THE PREFERRED EMBODIMENT

Figure 1:
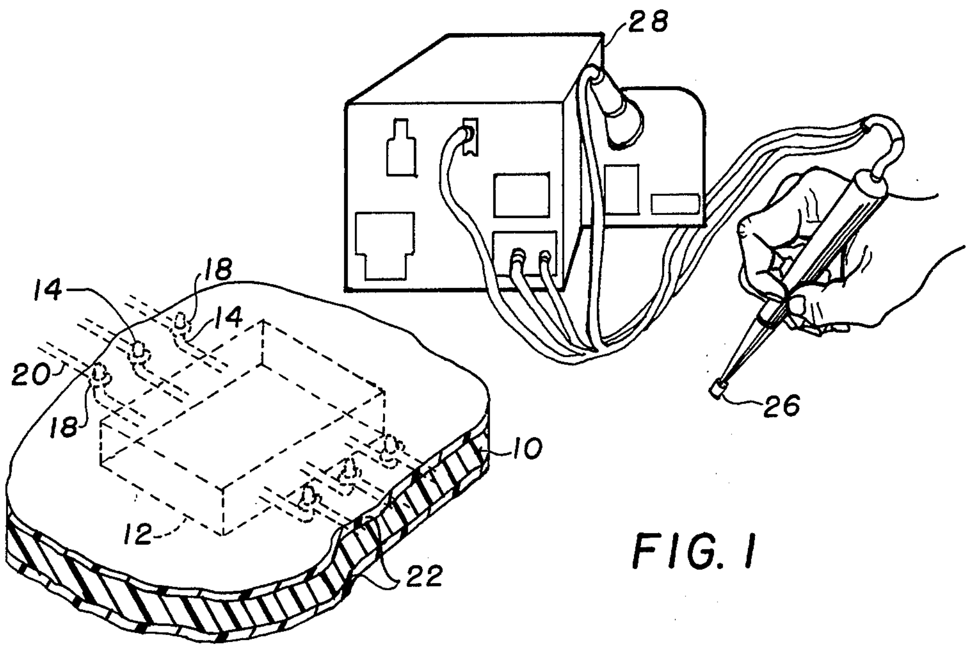
FIG. 1 is a top perspective view of a portion of a conventional printed circuit board covered with a conformal coating, showing a defective circuit component mounted in the underside thereof to be replaced by the novel method employing conventional solder extractor equipment.

Referring to the drawing where like reference numerals refer to similar parts throughout the figures there is illustrated in FIG. 1 a finished electrical printed circuit (PC) board 10 of typical design. The PC board has circuit components 12 (only one being illustrated) mounted on an underside thereof with lead wires 14 soldered at 16 to pad 18 and conductor runs 20 on the upper side of the board. The lead wires 14 extend through openings 19 in the PC board, which openings may be provided with a metal eyelet or plated coating 21 to provide continuity between the external and/or internal conductor runs in the PC board, as well as for providing a solderable base. It is understood that this soldered connection is illustrative of only one type of many connections which can be repaired practicing the novel method of this invention.

One of the problems associated with the repair of PC boards arises in the use of a thin protective conformal coating 22 which is applied entirely over all the parts of the assembled printed circuit board in a final fabrication operation. Such coatings are employed as a protective encapsulating measure against environmental conditions, such as moisture, humidity, corrosive effects and temperatures. A superior polyurethanetype coatting, one coating, "Parylene-C" (Chloro-P-Xylylene), manufactured by Union Carbide Company, has been recently employed on PC boards, which has complicated their repair. This type of coating has a higher melting temperature than the solder used in the connection making it impossible to use the conventional desoldering method of applying heat directly to the soldered area. Employing this conventional method, by the time the conformal coating has been sufficiently melted to enable its removal from the soldered area, the solder has already melted and dispersed, preventing its recapture before ruining the printed circuit board. Thus, it was found necessary in the art to use a hot knife to peel away the conformal coating around the soldered connection. Despite extreme care the technique frequently resulted in serious damage to the substrate and conductor runs, requiring expensive repairs, or eventual scrapping and replacement.

Figure 2:
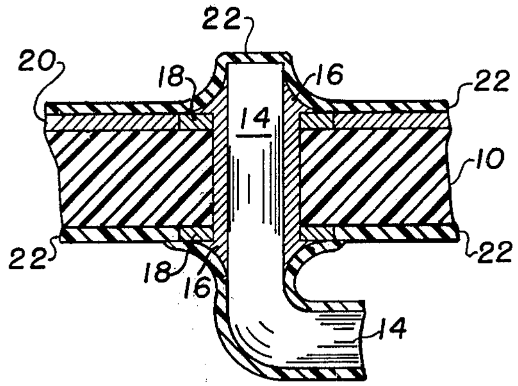
FIG. 2 is an enlarged cross-sectional view of one of the soldered component lead wires of FIG. 1 to be desoldered by the novel method to enable removal of the defective component.

FIGS. 2 to 6 illustrate the basic steps in the novel method of repairing PC board 10 to enable the replacement of circuit component 12, or to correct a defective soldered connection, depending on the specific casualty. FIG. 2 illustrates one of the finished soldered lead wire connections of FIG. 1 that is to be repaired and/or replaced to enable removal of a defective component 12.

Figure 3:
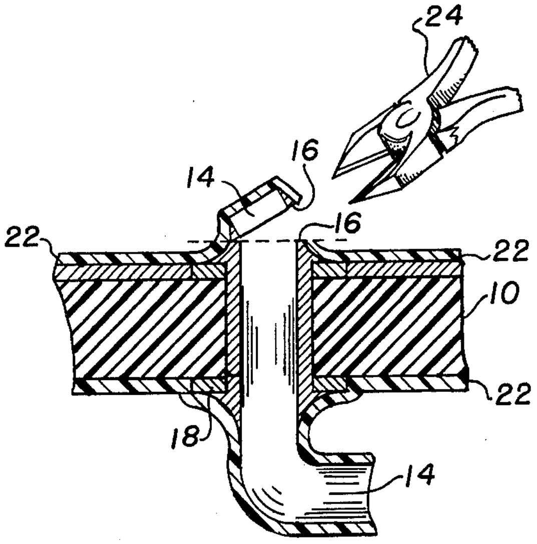
FIG. 3 is a similar view as FIG. 2 illustrating the first step in the novel method wherein the protruding upper end of the component lead wire and conformal coating therein is removed by cutting.
Figure 4:
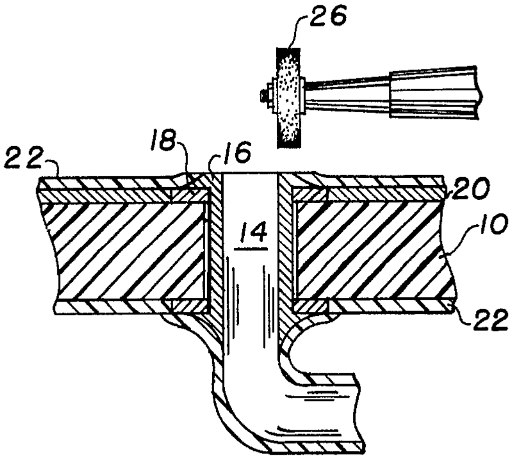
FIG. 4 is a similar view as FIG. 3 illustrating the second step in the novel method wherein the stub end of the component lead wire and soldered area is ground down into the soldered connection close to the lead pad, forming an outlet opening for the molten solder.
Figure 5:
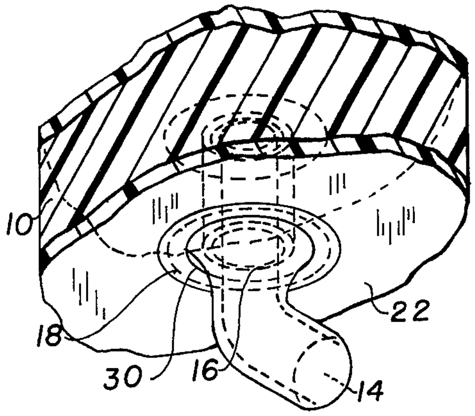
FIG. 5 is plan view of the underside of the printed circuit board of FIG. 2 illustrating the third step in the method of forming an air inlet opening by scribing through the conformal coating around the soldered area of the underside of the component lead wire.

The first step in the novel process is illustrated in FIG. 3, where the protruding, coating-covered butt end of the lead wire on the upper run-side of the board is cut off by means of an end cutter 24 or the like. In the second step of the method, most of the remaining stub end of the lead 14, a portion of solder fillet 16 and conformal coating 22 are ground down very close to pad 18 by means of an abrasive wheel 26, which may be one of the accessories of a solder extraction equipment 28, such as "SODR-X-TRACTOR" manufactured by the Pace Manufacturing Company. Removal of the conformal coating at the soldered fillet 16 around the stub end of conductor lead 14 is important in the in the method, as will be later seen, as it provides an outlet opening for the removal of the molten solder.

In the third step of the method, the PC board is inverted and a scribe mark 30 is made through the conformal coating into soldered fillet area 16 around lead 14 on the underside of the connection. The purpose of scribe or knife mark 30 is to provide an air inlet during the extraction of the molten solder, the next step to be described.

Figure 6:
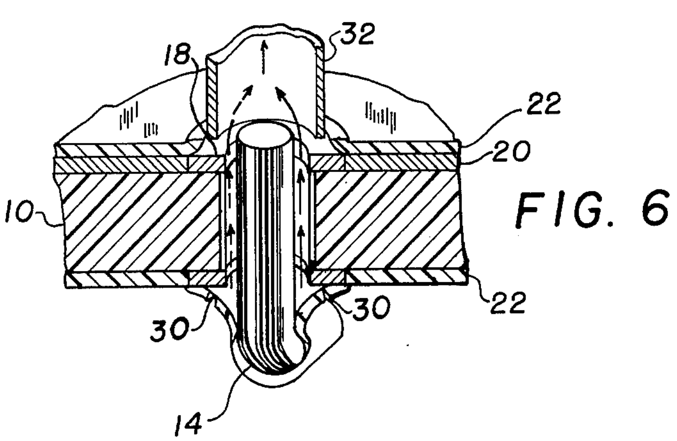
FIG. 6 is a perspective view of the upper side of the printed circuit board illustrating the fourth step in the method of simultaneously melting and sucking out the molten solder from the outlet opening around the lead wire by a hollow soldering iron, replacing the molten solder by air admitted through the inlet opening.

In the fourth step, illustrated in FIG. 6, a hollow solder extractor tip 32, which may be one of the accessories of equipment 28, is positioned over the butt end of conductor lead 14. It is important that the size of tip 32 be carefully chosen so that the diameter of the tip is not larger than the diameter of pad 18 to avoid damage to the PC board. Applying only a slight pressure on tip 32 to the pad 18, the solder is melted by the heated tip, and the molten solder is removed by suction through the hollow tip. As the solder is withdrawn from the connection through tip 32, it is replaced by air being admitted through the inlet opening formed by scribe 30. The direction of flow of the molten solder and of the air is illustrated by solid arrows and broken arrows, respectively, in FIG. 6. This venting enables the solder to be quickly and completely removed in a thorough and expeditious manner without damaging any of the component parts of the PC board.

The defective component 12 and its attached lead 14 can now be lifted free of the PC board. If component 14 has been bonded to the underside of the PC board, another accessory of the "Pace" equipment 28 enables the blowing of a controlled heat on the component to soften the adhesive to effect removal of the component by prying loose from the PC board.

The remaining steps include cleaning of the pad by careful abrading with a bullet grinding wheel (not illustrated), another accessory of the "Pace" equipment, to remove any old coating and solder materials. Thereafter, pads 18, and the area of the PC board having been occupied by the defective component, is cleansed with alcohol to remove any residue of old flux in the area of the connection.

The new replacement component is then prepared by cleansing with a solution of alcohol, and the lead wires bent for installation on the PC board. After soldering, the new component on the PC board and the soldered area is again cleansed with a solution of alcohol to remove any excess flux residue.

The reworked areas of the PC board are recoated with a touch-up of conformal coating, and, after inspection the reworked PC board is ready for reissue.

The invention provides a quick and reliable method for repairing PC boards and the like which reduces by over one half the reworking time, compared to previous methods described above. In addition to achieving high rework reliability, the rejection rate is greatly reduced, enabling a greater savings. Furthermore, the method enables a reduced quantity of PC boards to be stocked which is an important factor for advanced military land installations as well as on board naval ships having electronic repair capabilities.

Obviously many modifications and variations of the present invention are possible in the light of the above teachings. It is therefore to be understood that within the scope of the appended claims the invention may be practiced otherwise than as specifically described.

What is claimed is:

1. A method of repairing a soldered wire connection having a protective conformal coating thereover having a melting temperature higher than the melting temperature of the solder, the method comprising the steps of:
   forming inlet and outlet openings through said coating directly into the soldered area;
   heating the solder to melting temperature;
   removing the molten solder by suction at the outlet opening with the molten solder being replaced by air admitting through the inlet opening; and
   removing the unsoldered wire.

2. The method of claim 1 including the steps removing the protective coating on the solder at the air outlet by abrading.

3. A method of repairing an assembled printed circuit board having electrical components attached to one side of the board with lead wires extending through apertures in the board and projecting from the other side of the board forming a soldered terminal connection for printed circuit lines applied thereon;

said circuit board having a protective conformal coating applied to the surfaces of said printed circuit board and said connection, the melting temperature of the conformal coating being higher than the melting temperature of the solder;

forming inlet and outlet openings through said coatings directly into the soldered area;

heating the solder to melting temperature;

removing the molten solder by applying suction at the outlet opening with the molten solder being replaced by air admitted through the inlet opening to the soldered area; and removing the component and lead wire.

4. The method of claim 3 wherein said inlet and outlet openings are formed on opposite sides of the printed circuit board.

5. The method of claim 4 wherein said outlet opening is provided on the other side of the printed circuit board having the component and where the lead wire therefrom projects from the board.

6. The method of claim 5 including the steps of clipping the end of the lead wire protruding from the circuit board, and abrading the remaining wire stub and conformal coating to uncover the solder and form the outlet opening.

7. The method of claim 6 including the step of scribing a line through said coating at the soldered connection on the component side of the circuit board to form said inlet opening.

8. A method of repairing an assembled printed circuit board having an electrical component attached to one side of the circuit board, said component having a lead wire extending through an aperture in the board and projecting from the other side of the board forming a soldered terminal connection for printed circuit lines applied thereon, said circuit board having a conformal coating applied to the printed circuit surfaces of said board and connections having a melting temperature exceeding the melting temperature of the solder; the method comprising the steps of:

clipping the lead wire projecting from said other side of the circuit board;

abrading the stubbed end of the lead line and conformal coating to uncover the solder of the connection and forming a first opening directly thereto;

forming a second opening through the conformal coating directly into the soldered connection on the component side of the circuit board;

heating the soldered connection to melting temperature;

removing the molten solder by suction at one opening with the molten solder of the connection being replaced by air admitted at the other opening;

removing the component and lead wire;

abrading the connection to remove any coating residue;

installing a new component and soldering the connection;

recoating the abraded areas with the conformal coating.

* * * * *